United States Patent
Nakiboğlu et al.

(10) Patent No.: US 11,320,751 B2
(45) Date of Patent: May 3, 2022

(54) APPARATUS INCORPORATING A GAS LOCK

(71) Applicant: ASML Netherlands B.V., Veldhoven (NL)

(72) Inventors: Güneş Nakiboğlu, Eindhoven (NL); Dries Vaast Paul Hemschoote, Vosselaar (BE); Remco Yuri Van de Moesdijk, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/967,785

(22) PCT Filed: Jan. 18, 2019

(86) PCT No.: PCT/EP2019/051195
§ 371 (c)(1),
(2) Date: Aug. 6, 2020

(87) PCT Pub. No.: WO2019/158300
PCT Pub. Date: Aug. 22, 2019

(65) Prior Publication Data
US 2021/0041794 A1    Feb. 11, 2021

(30) Foreign Application Priority Data
Feb. 16, 2018   (EP) .................................... 18157048

(51) Int. Cl.
G03F 7/20   (2006.01)
(52) U.S. Cl.
CPC ...... *G03F 7/70808* (2013.01); *G03F 7/70875* (2013.01); *G03F 7/70916* (2013.01)

(58) Field of Classification Search
CPC ............. G03F 7/70808; G03F 7/70875; G03F 7/70916; G03F 7/70933; G03F 7/70716;
(Continued)

(56) References Cited

U.S. PATENT DOCUMENTS

| | | | | |
|---|---|---|---|---|
| 2002/0057423 A1* | 5/2002 | Nogawa | .............. | G03F 7/70933 355/75 |
| 2005/0117134 A1* | 6/2005 | Nagasaka | ............... | G03F 7/707 355/53 |

(Continued)

FOREIGN PATENT DOCUMENTS

| WO | WO 2009/124660 A1 | 10/2009 |
|---|---|---|
| WO | WO 2017/005463 A1 | 1/2017 |

OTHER PUBLICATIONS

International Search Report and Written Opinion of the International Searching Authority directed to related International Patent Application No. PCT/EP2019/051195, dated Apr. 4, 2019; 12 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

An apparatus, which may form part of a lithographic apparatus, comprises a substrate table, a projection system, a gas lock and a gas flow guide. The substrate table is suitable for supporting a substrate. The projection system has a body which defines an interior and an opening. The projection system is configured and arranged to project a radiation beam through the opening onto a substrate supported by the substrate table. The gas lock is suitable for providing a gas flow from the opening away from the interior. The gas flow guide is configured to guide at least a portion of the gas flow away from the substrate supported by the substrate table.

19 Claims, 5 Drawing Sheets

(58) Field of Classification Search
CPC .. G03F 7/70341; G03F 7/707; G03F 7/70866; G03B 27/52; H01L 21/0274
See application file for complete search history.

(56) References Cited

U.S. PATENT DOCUMENTS

| | | | |
|---|---|---|---|
| 2006/0209279 A1* | 9/2006 | Nagasaka | G03F 7/70816 355/53 |
| 2006/0215137 A1 | 9/2006 | Hasegawa et al. | |
| 2007/0159608 A1* | 7/2007 | Chibana | G03F 7/70933 355/30 |
| 2012/0229782 A1 | 9/2012 | Nienhuys et al. | |
| 2015/0331338 A1 | 11/2015 | Arlemark et al. | |
| 2017/0176877 A1 | 6/2017 | Ranjan et al. | |

OTHER PUBLICATIONS

International Preliminary Report on Patentability directed to related International Patent Application No. PCT/EP2019/051195, dated Aug. 18, 2020; 9 pages.

* cited by examiner

APPARATUS INCORPORATING A GAS LOCK

CROSS-REFERENCE TO RELATED APPLICATIONS

This application claims priority of EP application 18157048.2 which was filed on Feb. 16, 2018 and which is incorporated herein in its entirety by reference.

FIELD

The present invention relates to an apparatus incorporating a gas lock. In particular, the apparatus may form part of a lithographic apparatus comprising substrate table for supporting a substrate (e.g. a silicon wafer) and a projection system arranged to project a patterned radiation beam onto the substrate. The gas lock may be arranged to at least partially protect the interior of the projection system from ingress of contaminants.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Since EUV radiation is strongly absorbed by matter, within an lithographic apparatus using EUV radiation the optical path of the EUV radiation is under vacuum conditions (i.e. at pressures significantly below atmospheric pressure). In particular, the projection system, which comprises a system of optical elements for projecting the EUV radiation onto a substrate, may be held under vacuum conditions. The EUV radiation is projected through an opening defined by the projection system onto the substrate. It is desirable to limit ingress of contaminants into the projection system. It is known to provide a dynamic gas lock for this purpose.

It may be desirable to provide alternative arrangements of gas locks, and apparatus comprising such gas locks, that at least partially address one or more problems associated with known arrangements, whether identified herein or otherwise.

SUMMARY

According to a first aspect of the invention there is provided an apparatus comprising: a substrate table for supporting a substrate; a projection system having a body, the body defining an interior and an opening, the projection system being configured and arranged to project a radiation beam through the opening onto a substrate supported by the substrate table; a gas lock for providing a gas flow from the opening away from the interior; and a gas flow guide configured to guide at least a portion of the gas flow away from the substrate supported by the substrate table.

The apparatus according to the first aspect of the invention may form part of a lithographic apparatus. For example, in use the substrate table may support a silicon wafer and the projection system may be arranged to project a patterned radiation beam onto the wafer (for example to form a diffraction limited image of a reticle). In use a plurality of distinct target regions (which may correspond to one or more dies) may be sequentially exposed by moving the substrate table relative to the projection system between exposures. In addition, each such exposure may be a scanning exposure during which the substrate table moves in a scanning direction relative to the opening.

The apparatus according to the first aspect of the invention is advantageous since it provides a gas lock that can protect the interior of the projection system from the ingress of contaminants. For example, it can prevent such contaminants impinging on optical elements (for example mirrors or lenses). In turn, this can improve the optical performance of the projection system.

Furthermore, the gas flow guide is configured to guide at least a portion of the gas flow away from the substrate supported by the substrate table. This is in contrast to conventional gas locks provided between projections systems and substrate tables wherein a primary gas flow from the opening of the projection system passes is directed towards the substrate table. This distinction over conventional gas locks has a number of advantages, as now discussed.

With an existing arrangement where the gas flow from the opening passes over the substrate and substrate table, the gas flow will deliver a heat load to the substrate. In turn, this can cause thermal deformation of the substrate, which can be detrimental to the quality of the formed image.

It will be appreciated that, in general, in addition to the portion of gas provided by the gas lock which forms the gas flow from the opening away from the interior, another portion of the gas which is provided by the gas lock will flow into the interior of the projection system. The inventors have realized that in conventional arrangements (wherein a primary gas flow from the opening of the projection system is directed towards the substrate table) the proportion of the total gas provided by the gas lock which forms the gas flow from the opening away from the interior is dependent on the position of the substrate table relative to the opening. This is because in different positions the flow path away from the opening of the housing will, in general, have a different fluid conductance as a different restriction of the gas is provided at the opening of the projection system. The inventors have further realized that with such an arrangement during use, as the substrate table moves relative to the opening, and when the rate of gas production is constant, this will result in variations in the pressure both within the interior of the projection system and outside the projection system, for example in a volume or space within which the substrate table (and any substrate supported thereby) is disposed. Such a volume or space may be referred to as a substrate table compartment or, alternatively, a wafer stage compartment. It will be appreciated that, unless stated to the contrary, as used herein "proximate" the substrate table is intended to mean within in a volume or space within which the substrate table (and any substrate supported thereby) is disposed. The use of the term "proximate" should not be interpreted as implying that any limitation on the dimensions of the volume or space within which the substrate table (and any substrate supported thereby) is disposed. These pressure variations are undesirable, as now explained.

First, these variations in the pressure can result in time varying thermal distortions of the substrate caused by the heat load provided by the gas flow.

Second, it will be appreciated that it may be important to accurately determine and control the position of the substrate table relative to the opening of the projection system. Within a typical lithographic apparatus, such determinations of the position of the substrate table relative to the opening of the projection system are typically made using interferometric devices. Such interferometric devices typically comprise components mounted on the substrate table and mounted on a reference object relative to which it is desirable to determine the position of the substrate table (for example an isolated frame to which the projection system is connected). For example, such interferometric devices may comprise a light source mounted on an isolated frame to which the projection system is connected and a mirror mounted on the substrate table arranged to reflect light from the light source. However, if the pressure surrounding the substrate table varies with time then this will result in an error in the determined position. In particular, the light may travel from the light source to the mirror over any desired distance within the volume or space within which the substrate table (and any substrate supported thereby) is disposed and, therefore, any pressure variations within this volume or space may result in an error in the determined position. In turn, this can contribute, for example, to overlay errors in the formed image.

In contrast to such known arrangements, the gas flow guide of the apparatus of the first aspect of the invention is configured to guide at least a portion of the gas flow away from the substrate supported by the substrate table. Advantageously, this avoids the above-described problems.

It will be appreciated that providing a gas flow "from the opening away from the interior" is intended to mean providing a gas flow generally from the vicinity of the opening away from the interior. For example, the gas flow may be provided within the interior of the body of the projection system (for example proximate the opening), in which case the gas flow from the opening away from the interior flows through the opening. Alternatively, the gas flow may be provided outside of the interior of the body of the projection system but proximate to the opening. Additionally or alternatively, the opening may be considered to have a non-zero dimension in a direction generally perpendicular to the opening (i.e. in a direction which is generally aligned with a propagation direction of the radiation beam projected through the opening). For example, the opening may be defined by a wall with a non-zero thickness. For embodiments wherein the opening is considered to have a non-zero dimension in a direction generally perpendicular to the opening the gas flow may be provided at the opening.

The gas lock may be arranged to provide the gas flow through the opening and away from the interior.

The gas flow guide may be configured to guide the at least a portion of the gas flow along a fluid pathway of substantially fixed fluid conductance.

It will be appreciated that the gas flow guide may be configured to guide the at least a portion of the gas flow along a fluid pathway of substantially fixed fluid conductance when the apparatus is disposed in a first, operating configuration.

It will be appreciated that as used in this context the fluid conductance of a fluid pathway is a measure of how easily gas flows along the fluid pathway. For example, the fluid conductance may be proportional to a ratio of a total throughput of gas in the fluid pathway to a pressure differential across the fluid pathway.

Advantageously, by guiding the at least a portion of the gas flow along a fluid pathway of substantially fixed fluid conductance, when the rate of gas production by the fluid lock is constant there will be substantially no variation in the pressure within the interior of the projection system or proximate the substrate table.

The gas flow guide may be configured such that more than half of the gas flow from the opening away from the interior is directed away from the substrate supported by the substrate table.

It will be appreciated that the gas flow guide may be configured such that at more than half of the gas flow from the opening away from the interior is directed away from the substrate supported by the substrate table when the apparatus is disposed in a first, operating configuration.

That is to say, the gas flow guide may be considered to direct gas along a primary pathway, which receives more than half of the gas flow from the opening away from the interior.

Ensuring that more than half of the gas flow from the opening away from the interior is directed away from the substrate supported by the substrate table may be achieved by ensuring that the fluid conductance of a fluid pathway along which the at least a portion of the gas flow is directed by the gas guide is sufficiently high.

In some embodiments, the gas flow guide may be configured such that at least 80% the gas flow from the opening away from the interior is directed away from the substrate supported by the substrate table. In some embodiments, the gas flow guide may be configured such that at least 90% the gas flow from the opening away from the interior is directed away from the substrate supported by the substrate table.

The gas flow guide may be configured to guide the at least a portion of the gas flow along a fluid pathway having a greater fluid conductance than other available fluid pathways.

It will be appreciated that the gas flow guide may be configured to guide the at least a portion of the gas flow along a fluid pathway having a greater fluid conductance than other available fluid pathways when the apparatus is disposed in a first, operating configuration.

With such an arrangement gas will preferentially flow along said fluid pathway.

Additionally or alternatively, ensuring that more than half of the gas flow from the opening away from the interior is directed away from the substrate supported by the substrate table may be achieved by ensuring that a pressure difference across a fluid pathway along which the at least a portion of the gas flow is directed by the gas guide is sufficiently high.

The gas flow guide may comprise a pump arranged to draw the at least a portion of the gas flow along a fluid pathway.

The pump may, for example, comprise a vacuum pump.

The apparatus may further comprise a movement mechanism for moving the substrate table relative to the opening of the projection system.

The movement mechanism may be used to move a substrate relative to the opening between exposures of two different target regions (for example to place the next target region to be exposed in a position for receiving the radiation beam. In addition, the movement mechanism may be used during a scanning exposure of one or more target regions.

The apparatus may further comprise an intermediate member arranged between the opening and the substrate table and the gas flow guide may comprise a pathway defined between the intermediate member and the projection system.

It will be appreciated that the intermediate member may comprise an opening that is generally aligned with the opening of the projection system for transmission of the radiation beam. This allows the radiation that is projected through the opening of the projection system to irradiate a substrate supported by the substrate table.

In use, the intermediate member may be disposed in a first, operating position wherein it is in close proximity to a region of the substrate surrounding the region of the substrate which is being irradiated by the radiation beam. With such an arrangement, the intermediate member can act as a seal, or at least a restriction, so as to at least partially block the gas flow from flowing towards the region of the substrate surrounding the region of the substrate which is being irradiated by the radiation beam. It will be appreciated that, as used here the intermediate member being in close proximity to a region of the substrate surrounding the region of the substrate which is being irradiated by the radiation beam is intended to mean sufficiently close that the fluid conductance through the clearance between the intermediate member and the substrate is significantly smaller than the fluid conductance through the pathway defined between the intermediate member and the projection system.

In addition, the intermediate member may be configured such that gas flowing along the pathway defined between the intermediate member and the projection system is generally directed away from the substrate table.

The intermediate member may be configured to direct gas flowing along the pathway defined between the intermediate member and the projection system into a cavity formed within a wall of the body of the projection system.

It will be appreciated that such a cavity within the wall of the body of the projection system may be isolated from the interior of the body of the projection system.

The wall of the body may be considered to comprise and inner wall, which defines the interior, and an outer wall. The cavity may be defined by the inner and outer walls.

The pathway defined between the intermediate member and the projection system may be defined between the intermediate member and the inner wall of the body of the projection system. In order to direct gas flowing along the pathway defined between the intermediate member and the projection system into a cavity formed within a wall of the body of the projection system, the intermediate member may comprise a sealing portion which extends towards, and is in sealing relationship with, the outer wall of the body of the projection system.

The intermediate member may comprise a sealing element which extends towards, and is in sealing relationship with, the wall of the body of the projection system around substantially the entire perimeter of the opening of the projection system.

It will be appreciated that, as used here the sealing element being in sealing relationship with the wall of the body of the projection system around substantially the entire perimeter of the opening of the projection system is intended to mean that the fluid conductance through any clearance between the sealing element and the wall of the body of the projection system is significantly smaller than the fluid conductance through an alternative exhaust pathway (for example into a cavity formed within a wall of the body of the projection system).

The sealing element may comprise a rigid flange portion and a clearance may be provided between the rigid flange portion and a portion of the wall of the body of the projection system which it is in sealing relationship with.

The clearance may allow the sealing element to be in sealing relationship with the wall of the body of the projection system whilst allowing the intermediate member to move relative to the wall.

The apparatus may further comprise a flexible membrane connected between the intermediate member and the wall of the body of the projection system.

The flexible membrane may allow the intermediate member to be in sealing relationship with the wall of the body of the projection system whilst allowing the intermediate member to move relative to the wall.

The intermediate member may be movable relative to the projection system between at least a first, operating position and a second, retracted position.

The position of the intermediate member may define a configuration of the apparatus. When the intermediate member is disposed in the first, operating position the apparatus may be considered to be in a first, operating configuration. When the intermediate member is disposed in the second, retracted position the apparatus may be considered to be in a second, retracted configuration.

In use, when a substrate is being irradiated by the radiation beam the intermediate member may be disposed in the first, operating position. As discussed above, when disposed in the first, operating position the intermediate member may be in close proximity to a region of the substrate surrounding the region of the substrate which is being irradiated by the radiation beam. However, it may be desirable to allow the intermediate member to be movable relative to the projection system to a second, retracted position, for example to prevent the intermediate member from contacting a substrate, for example, if the substrate table moves rapidly and/or unpredictably towards the intermediate member. Movement of the intermediate member, for example by of the order of ±4 mm may be desirable in case an out-of-control situation occurs. For instance, in case a substrate table positioning module makes an unplanned fast upward movement, there will be significant damage to the substrate table and intermediate member unless the intermediate member can move sufficiently to avoid contact.

It may also be desirable to be able to adjust the clearance between the intermediate member and a substrate supported by the substrate table.

The intermediate member may be operable to cool a region of the substrate surrounding the region of the substrate which is irradiated by the radiation beam.

The intermediate member may comprise a cooling member which may be maintained at a lower temperature than the substrate table (and any substrate supported thereby). For example, the cooling member may be maintained at a temperature of around −70° C. The substrate table may be maintained at a suitable temperature to ensure stability of substrates supported thereby such as, for example, around 22° C. (which is, for example, suitable for silicon wafers). It will be appreciated that the cooling member may be provided with a suitable refrigeration system (for example a closed loop around which coolant is circulated) so as to maintain it at a desired temperature.

The intermediate member may be operable to direct a cooling gas flow to a region of the substrate surrounding the region of the substrate which is irradiated by the radiation beam.

The intermediate member may comprise a cooling member which is maintained at a lower temperature than the substrate table any may further comprise a heat shield which is arranged to thermally insulate the substrate table and/or the projection system from the cooling member.

According to a second aspect of the invention there is provided a lithographic apparatus comprising: an illumination system configured to condition a radiation beam; a support structure constructed to support a patterning device, the patterning device being capable of imparting the radiation beam with a pattern in its cross-section to form a patterned radiation beam; and the apparatus according to the first aspect of the invention, wherein the projection system is configured receive the patterned radiation beam and to project it onto a substrate supported by the substrate table.

According to a third aspect of the invention there is provided a method of operating an apparatus comprising a projection system having a body, the body defining an interior and an opening, the method comprising the steps of: arranging a substrate on a substrate table; projecting a radiation beam through the opening of the projection system onto the substrate supported by the substrate table; providing a gas flow from the opening away from the interior; and guiding at least a portion of the gas flow away from the substrate supported by the substrate table.

The method according to the third aspect of the invention is advantageous since a gas flow is provided from the opening away from the interior, which can protect the interior of the projection system from the ingress of contaminants.

Furthermore, the method involves guiding at least a portion of the gas flow away from the substrate supported by the substrate table. As with the apparatus of the first aspect of the invention, the method according to the third aspect of the invention is advantageous for a number of reasons. First, it prevents the gas flow from delivering a heat load to the substrate, which could cause thermal deformation of the substrate, to the detriment of the quality of the formed image. Second, for the reasons set out above in relation to the first aspect of the invention, it can prevent variations in the pressure both within the interior of the projection system and proximate the substrate table (and any substrate supported thereby). Such pressure variations are undesirable, since they can result in time varying thermal distortions of the substrate (caused by the heat load provided by the gas flow) and can result in errors in position measurements of the substrate table, which can contribute, for example, to overlay errors in the formed image.

The apparatus may, for example, comprise an apparatus according to the first aspect of the invention. It will be appreciated that the method according to the third aspect of the invention may comprise any of the features, of equivalent features, to those of the apparatus of the first aspect of the invention as appropriate. In particular, the apparatus may comprise a gas flow guide configured to guide at least a portion of the gas flow away from the substrate supported by the substrate table.

In the method according to the third aspect of the invention the apparatus may comprise the apparatus according to the first aspect of the invention.

The method may further comprise the step of drawing the gas flow from the opening away from the interior and away from the substrate supported by the substrate table.

The gas flow may be drawn from the opening away from the interior and away from the substrate supported by the substrate table using a pump. The pump may, for example, comprise a vacuum pump.

BRIEF DESCRIPTION OF THE DRAWINGS

Embodiments of the invention will now be described, by way of example only, with reference to the accompanying schematic drawings, in which.

DETAILED DESCRIPTION

Figure 1:
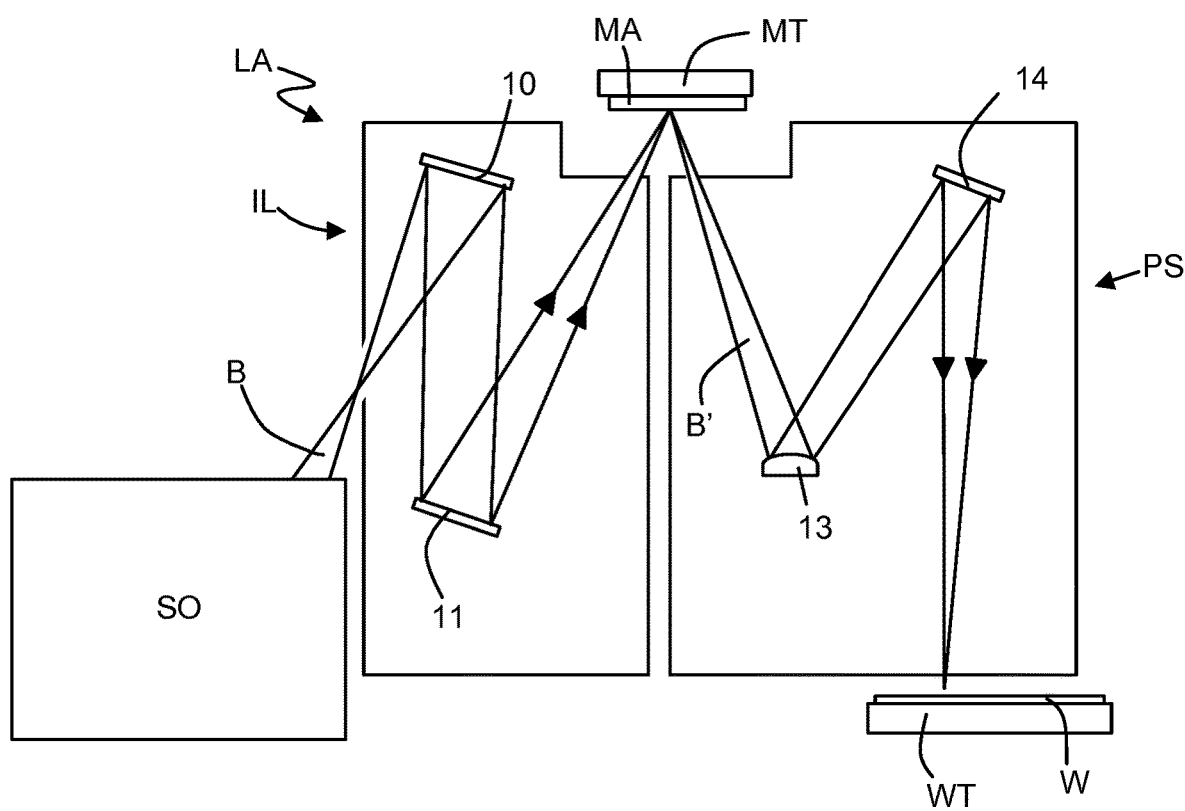
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

The projection system PS is connected to an isolated frame. For example the isolated frame (which may be referred to as a metro frame) may be supported by a base frame, which may be supported on the ground, such that it is substantially isolated from external influences (such as vibrations in the base frame). This isolation may be achieved by the use of acoustically damping mounts, which support the isolated frame on the base frame BF. The acoustically damping mounts may be actively controlled to isolate vibrations which are introduced by the base frame and/or by the isolated frame itself.

The support structure MT is movably mounted to the isolated frame via a first positioning device. The first positioning device may be used to move the patterning device MA, and to accurately position it, relative to the isolated frame (and the projection system PS which is connected to the frame). The substrate table WT is movably mounted to the isolated frame via a second positioning device. The second positioning device may be used to move the substrate W, and to accurately position it, relative to the isolated frame (and the projection system PS which is connected thereto).

The projection system PS has a body or housing, which defines an interior and an opening. The two mirrors 13, 14 are disposed within the interior and the projection system PS is configured and arranged to project the patterned EUV radiation beam B' through the opening onto a substrate W supported by the substrate table WT.

The projection system PS is configured to project the patterned EUV radiation beam B' onto the substrate W. In particular, the projection system PS is configured to project the patterned EUV radiation beam B' onto a generally rectangular exposure region in an image plane of projection system PS such that, in this image plane (which generally coincides with a surface of the substrate W) the radiation beam B' is a generally rectangular band of radiation. Therefore, the opening may be generally rectangular. The generally rectangular exposure region in the image plane of projection system PS or the generally rectangular band of radiation may be referred to as a slit or an exposure slit.

In use a plurality of distinct target regions (which may correspond to one or more dies) of a substrate W may be sequentially exposed by moving the substrate table WT relative to the projection system PS between exposures (so as to change which of the target regions is disposed in the exposure region of the image plane). In addition, each such exposure may be a scanning exposure during which the substrate table WT moves in a scanning direction relative to the projection system PS such that the target region being exposed moves, or scans through the exposure region in a scanning direction. To achieve this functionality, the lithographic apparatus LA is provided with actuators for moving the substrate table WT relative to the projection system PS. These actuators may be considered to form a movement mechanism.

Each point in the exposure region of the image plane will, in general, receive a cone of radiation (i.e. will receive radiation beams with a range of angles of incidence). Therefore, proximate the opening, the interior of the body may taper inwards towards the opening (in both directions perpendicular to an optical axis of the patterned EUV radiation beam B'). This tapered portion of the housing proximate the opening may be described as generally funnel shaped and may be referred to as a funnel portion.

An embodiment of the present invention is now described with reference to schematic FIG. 2.

Figure 2:
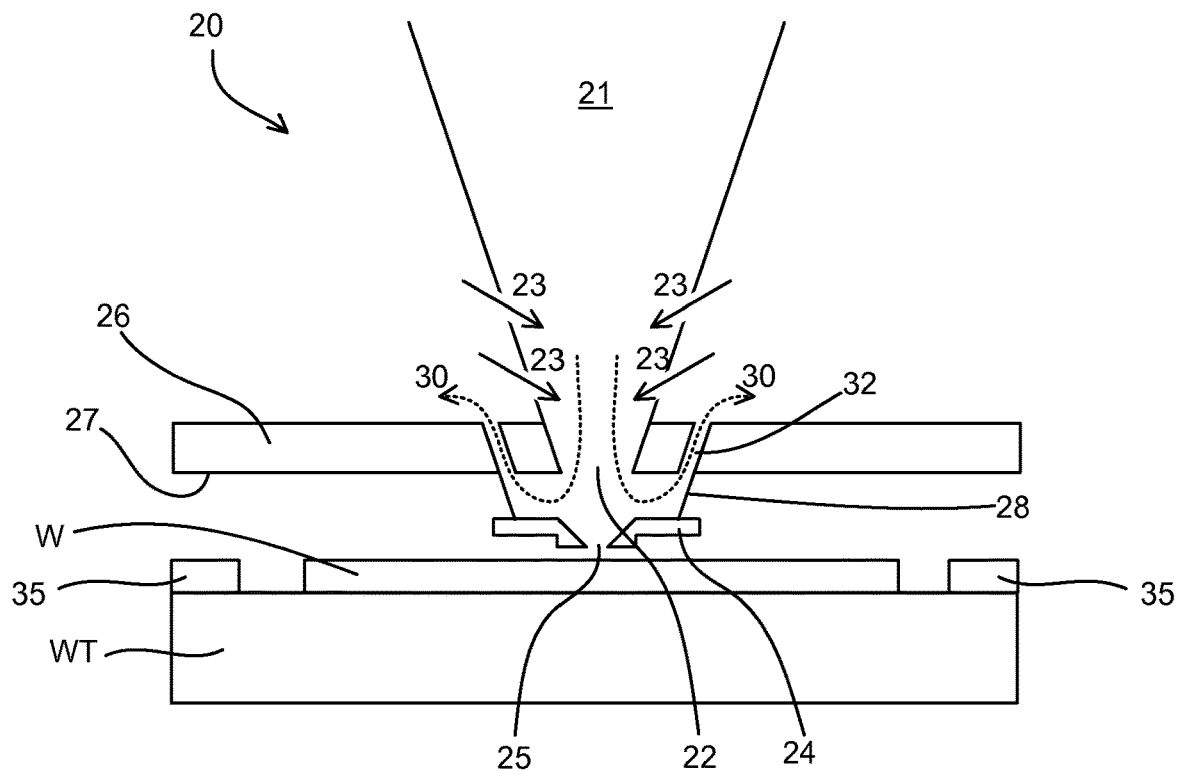
FIG. 2 shows an apparatus according to an embodiment of the present invention, which may form part of the lithographic apparatus shown in FIG. 1, and which comprises a substrate table for supporting a substrate, a projection system (only part of the projection system is shown), a gas lock and a gas flow guide.

FIG. 2 shows an apparatus 20 comprising a substrate table WT for supporting a substrate W and a projection system (only part of the projection system is shown). The apparatus 20 may form part of the lithographic apparatus LA shown schematically in FIG. 1. FIG. 2 shows a portion of a body or housing of the projection system, which defines an interior 21 and an opening 22 (only a tapered portion of the interior 21 proximate the opening 22 is shown).

The apparatus 20 further comprises a gas lock arranged to provide a gas flow through the opening away from the interior of the projection system PS. This gas flow is indicated schematically by arrows 23, indicating that the gas is directed through apertures in an interior wall of the body or housing of the projection system and into interior 21. The gas flow 23 may comprise any suitable gas such as, for example, hydrogen or nitrogen. The apertures are arranged to direct the gas flow 23 generally towards opening 22. By doing so, the gas lock protects the interior of the projection system PS from the ingress of contaminants. For example, it can prevent such contaminants impinging on the mirrors 13, 14 which, in turn, improves the optical performance of the projection system PS.

Embodiments of the present invention further comprise a gas flow guide that is configured to guide at least a portion of the gas flow (which is directed through the opening by the gas lock) away from the substrate W supported by the substrate table WT, as described further with reference to FIGS. 2 to 6.

In some embodiments, the apparatus further comprises an intermediate member 24 arranged between the opening 22 and the substrate table WT. The intermediate member 24 forms part of the gas flow guide, which is arranged to guide at least a portion of the gas flow 23 which passes though the opening 22 along a pathway defined between the intermediate member 24 and the projection system PS.

The intermediate member 24 comprises an opening 25 that is generally aligned with the opening 22 of the projection system for transmission of the radiation beam. This allows the radiation that is projected through the opening 22 of the projection system PS to irradiate a substrate W supported by the substrate table WT.

Furthermore, the apparatus 20 further comprises a barrier 26 that defines a surface 27 that is generally parallel to the substrate table WT (and any substrate W supported thereby). The barrier 26 surrounds and extends away from a portion of the projection system proximate the opening 22. The barrier 26 may be considered to form part of, or an extension of, the body or housing of the projection system PS.

It will be appreciated that the barrier 26 may be formed from a plurality of different components.

For example, the barrier 26 may comprise a substrate table heat shield (not shown), which may be arranged to at least partially thermally isolate the substrate table WT (and any substrate W supported thereby), which it may be desired to maintain at a particular temperature, from other parts of the apparatus (for example other parts of lithographic apparatus LA). Such a substrate table heat shield may comprise a water-cooled plate.

Additionally or alternatively, the barrier 26 may comprise or incorporate one or more mirrors (not shown) that may be used as part of a measurement system that is arranged to measure the position of the substrate table WT relative to the barrier 26 and/or the projection system PS (or, equivalently, relative to the isolated frame to which the barrier 26 and projection system PS are attached). For example, the barrier 26 may comprise one or more mirrors that are used for reflecting interferometer beams that are used as part of an interferometric positioning measurement system. Such a measurement system may be arranged to determine a position of the substrate table WT relative to the barrier 26 and/or the projection system PS (or, equivalently, relative to the isolated frame to which the barrier 26 and projection system PS are attached) in a direction generally perpendicular to a plane of the substrate table WT (which may be referred to as a z-direction).

Additionally or alternatively, the barrier 26 may comprise an access hatch or door, which can be moved, or removed, to provide access to the interior 21 of the projection system PS.

Additionally or alternatively, the barrier 26 may comprise components arranged to support the intermediate member 24. For example such components which support the intermediate member 24 may be connected to the projection system PS or to the isolated frame to which the projection system PS is attached. As will be described further below, with reference to FIG. 6, the intermediate member 24 may be mounted to the projection system PS, or to the isolated frame to which it is attached, such that the intermediate member 24 is movable relative to the projection system PS (and substrate table WT). Therefore, it will be appreciated that components which support the intermediate member 24 and which may form part of the barrier 26 may include actuators that facilitate this movement.

As shown schematically in FIG. 2, the apparatus 20 further comprises sealing element 28 which extends between the intermediate member 24 and the barrier 26. The sealing element 28 is in sealing relationship with both the intermediate member 24 and the barrier 26 around substantially the entire perimeter of the opening 22 of the projection system PS.

The intermediate member 24 and the sealing element 28 may be considered to form a gas flow guide. The intermediate member 24 and the sealing element 28 define a pathway along which at least a portion of the gas flow 23 (which is directed through the opening 22 by the gas lock) is directed. This portion of the gas flow 23 is indicated by arrow 30 and is directed away from the substrate W supported by the substrate table WT. As shown rather schematically in FIG. 2, a passageway 32 is provided in the barrier 26 and/or the body or housing of the projection system PS. The portion 30 of the gas flow 23 is directed by the intermediate member 24 and the sealing element 28 through passageway 32 and away from the substrate table WT (and any substrate W supported thereby).

Since the barrier 26 may be considered to form part of, or an extension of, the body or housing of the projection system PS, the apparatus shown in FIG. 2 may be considered to be configured to direct gas flowing along a pathway defined between the intermediate member 24 and the projection system PS into a cavity formed within a wall of the body of the projection system PS. It will be appreciated that such a cavity within the wall of the body of the projection system may be isolated from the interior 21 of the body of the projection system PS.

The wall of the body may be considered to comprise and inner wall, which defines the interior 21, and an outer wall. The cavity may be defined by the inner and outer walls.

The pathway defined between the intermediate member 24 and the projection system PS may be defined between the intermediate member 24 and the inner wall of the body of the projection system. The sealing member 28 is provided so as to direct gas flowing along this pathway defined between the intermediate member 24 and the projection system PS into a cavity formed within a wall of the body of the projection system PS.

The apparatus 20 shown in FIG. 2, is arranged to direct a portion 30 of the gas flow 23 away from the substrate W supported by the substrate table WT. This is in contrast to conventional gas locks provided between projections systems and substrate tables wherein a primary gas flow from the opening of the projection system passes is directed towards the substrate table. This distinction over conventional gas locks has a number of advantages, as now discussed, with reference to FIGS. 3 and 4A-4C.

Figure 3:
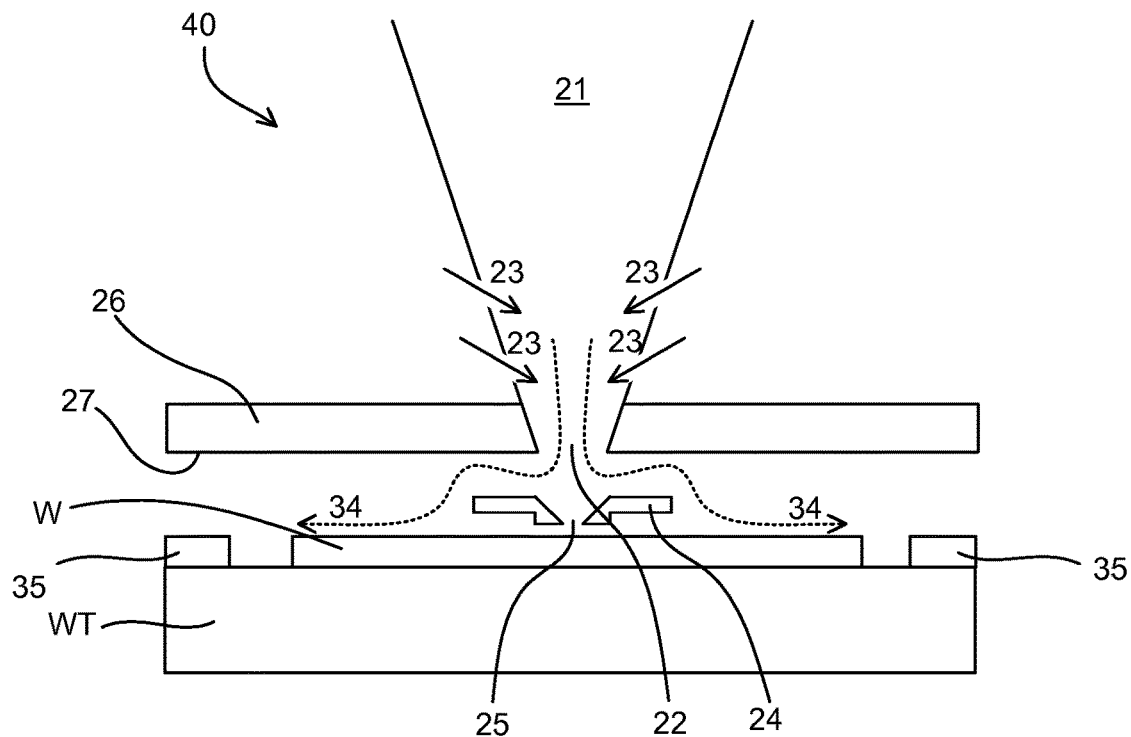
FIG. 3 shows an known apparatus, which may form part of the lithographic apparatus shown in FIG. 1, and which is similar to the apparatus shown in FIG. 2 but which does not comprise a gas flow guide.

FIG. 3 shows a prior art apparatus 40 comprising a substrate table WT for supporting a substrate W and a projection system (only part of the projection system is shown). The prior art apparatus 40 is generally of the form of the apparatus 20 shown in FIG. 2 although it does not comprise a gas flow guide that is configured to guide a portion of the gas flow away from the substrate W supported by the substrate table WT. It will be appreciated that components of prior art apparatus 40 that are generally equivalent to corresponding components of the apparatus 20 in FIG. 2 share common reference numerals therewith.

With the prior art arrangement, as shown in FIG. 3, the gas flow 34 from the opening 22 passes over the substrate W and substrate table WT. The gas flows generally between barrier 26 and substrate W. With such an arrangement, the gas flow will deliver a heat load to the substrate W. In turn, this can cause thermal deformation of the substrate W, which can be detrimental to the quality of the image formed by the lithographic apparatus LA.

It will be appreciated that, in general, in addition to the portion of the gas 23 which forms the gas flow through the opening 22 away from the interior 21, a portion of the gas 23 which is provided by the gas lock will flow into the interior 21 of the projection system. The inventors have realized that in conventional arrangements, as shown in FIG. 3, (wherein a primary gas flow from the opening 22 of the projection system PS is directed towards the substrate table WT) the proportion of the total gas 23 provided by the gas lock which forms the gas flow through the opening 22 away from the interior 21 is dependent on the position of the substrate table WT relative to the opening 22. This is because, when the substrate table WT is disposed in different positions the flow path away from the opening 22 of the housing 21 will, in general, have a different fluid conductance as a different restriction of the gas is provided at the opening 22 of the projection system PS.

It will be appreciated that as used herein the fluid conductance of a fluid pathway is a measure of how easily gas flows along the fluid pathway. For example, the fluid conductance may be proportional to a ratio of a total throughput of gas in the fluid pathway to a pressure differential across the fluid pathway.

Figure 4A:
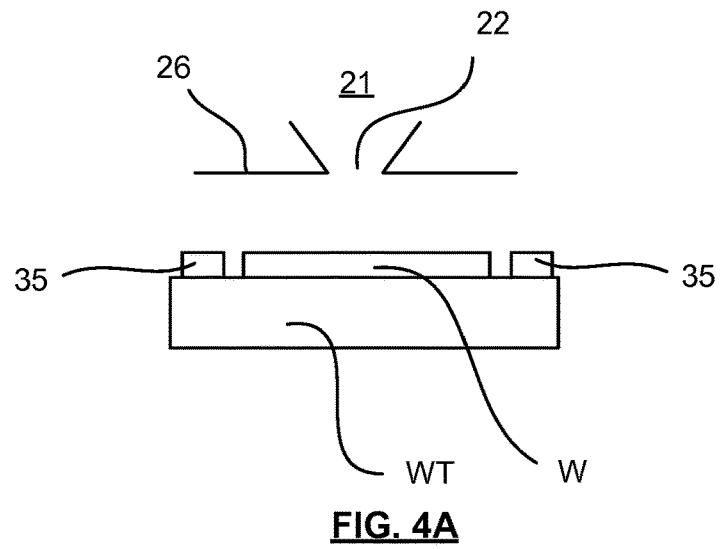
FIG. 4A schematically shows a barrier and the opening of a projection system disposed above a substrate table and substrate within an apparatus of the type shown in FIG. 3, the substrate table and substrate being disposed in a first position relative to the opening of the projection system.
Figure 4B:
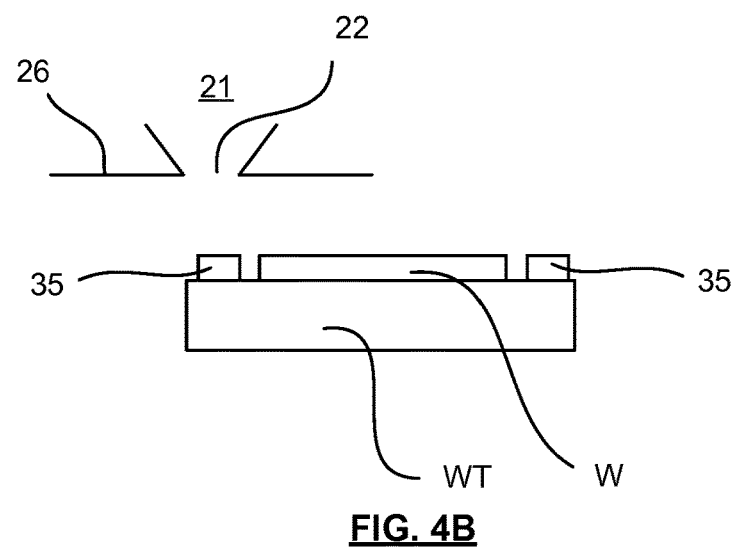
FIG. 4B schematically shows a barrier and the opening of a projection system disposed above a substrate table and substrate within an apparatus of the type shown in FIG. 3, the substrate table and substrate being disposed in a second position relative to the opening of the projection system.
Figure 4C:
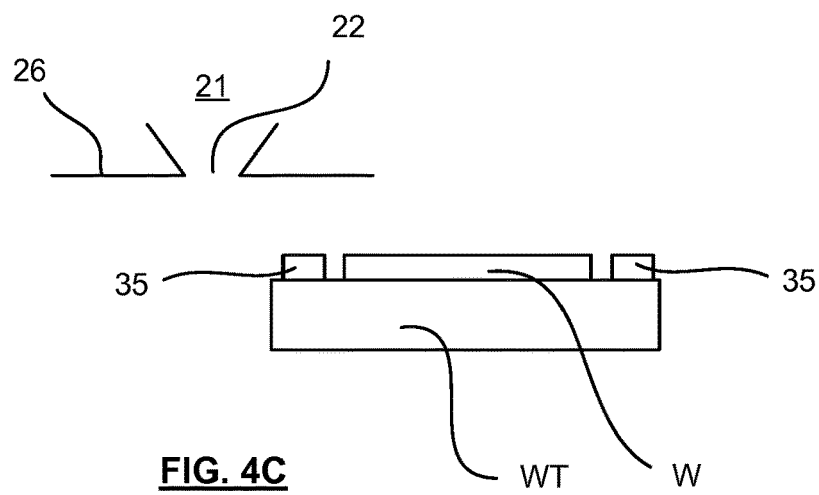
FIG. 4C schematically shows a barrier and the opening of a projection system disposed above a substrate table and substrate within an apparatus of the type shown in FIG. 3, the substrate table and substrate being disposed in a third position relative to the opening of the projection system.

This can be seen in FIGS. 4A-4C, which schematically shows barrier 26 and the opening 22 of the projection system PS disposed above substrate table WT and substrate W, the substrate table WT and substrate W being disposed in three different positions relative to the opening 22 of the projection system PS.

In FIG. 4A, the substrate table WT is disposed such that the opening 22 of the housing generally overlies a central portion of the substrate W. In this position, the substrate W and barrier 26 form a restriction for gas flowing out of the opening 22 generally in all directions away from the exposure region. In FIG. 4B, the substrate table WT is disposed such that the opening 22 of the housing generally overlies a peripheral portion of the substrate table WT. In this position, the substrate WT and barrier 26 form a restriction for gas flowing out of the opening 22. On one side of the opening 22 (the right hand side in FIG. 4B) the restriction is similar to the restriction provided (in all directions) when the substrate table WT is disposed in the position shown in FIG. 4A. However, on the other side of the opening 22 (the left hand side in FIG. FB) the substrate table WT provides substantially no restriction to gas flow such that this forms a pathway of increased fluid conductance. In FIG. 4C, the substrate table WT is disposed such that the opening 22 is generally clear of (i.e. not disposed adjacent to) the substrate table WT. In this position, the substrate WT provides substantially no restriction to gas flow such that a pathway of increased fluid conductance is formed.

The inventors have further realized that with such a prior art arrangement (as described above with reference to FIGS. 3 to 4C), during use, as the substrate table WT moves relative to the opening 22, and when the rate of gas production 23 is constant, this will result in variations in the pressure both within the interior 21 of the projection system and outside the projection system, for example in a volume or space within which the substrate table WT (and any substrate W supported thereby) is disposed. It will be appreciated that, unless stated to the contrary, as used herein "proximate" the substrate table is intended to mean within a volume or space within which the substrate table (and any substrate supported thereby) is disposed. These pressure variations are undesirable, as now explained.

First, these variations in the pressure can result in time varying thermal distortions of the substrate W caused by the heat load provided by the gas flow.

Second, it will be appreciated that it may be important to accurately determine and control the position of the substrate table WT relative to the opening 22 of the projection system PS. Within a typical lithographic apparatus LA, such determinations of the position of the substrate table WT relative to the opening of the projection system PS are typically made using interferometric devices. Such interferometric devices typically comprise components mounted on the substrate table WT and mounted on a reference object relative to which it is desirable to determine the position of the substrate table WT (for example an isolated frame to which the projection system PS is connected). For example, such interferometric devices may comprise a light source mounted on an isolated frame to which the projection system is connected and a mirror mounted on the substrate table arranged to reflect light from the light source. Such interferometric devices may be referred to as position sensors. Two such interferometric devices 35 are shown schematically in FIGS. 2, 3 and 4A-4C mounted on the substrate table WT. It will be appreciated that these interferometric devices 35 will also comprise other components (not shown) mounted on a reference object, for example an isolated frame to which the projection system PS is connected. These interferometric devices 35 can be used so as to accurately control the position of the substrate table WT relative to the isolated frame to which the projection system PS is attached, for example so as to position different target portions of the substrate W in the path of the patterned radiation beam B'.

However, if the pressure surrounding the substrate table WT varies with time then this will result in an error in the position determined by such interferometric devices 35. In particular, light may travel from a light source (for example on an isolated frame to which the projection system PS is connected) to part of the interferometric device 35 on substrate table WT over any desired distance within the volume or space within which the substrate table WT (and any substrate W supported thereby) is disposed and, therefore, any pressure variations within this volume or space may result in an error in the determined position. In turn, this can contribute, for example, to overlay errors in the formed image.

In contrast to such known arrangements, the gas flow guide (formed by the intermediate member 24 and the sealing element 28) of the apparatus 22 is configured to guide at least a portion of the gas flow away from the substrate supported by the substrate table. Advantageously, this avoids the above-described problems.

Further details of the intermediate member 24 are now discussed with reference to FIG. 5, which shows some parts of the apparatus 20 shown in FIG. 2 in greater detail. For clarity, the sealing member 28 is not shown in FIG. 5 (but will be discussed below with reference to FIG. 6).

The gas flow 23 discussed above with reference to FIGS. 2 and 3 is provided from channels 33 in a wall of the projection system PS, via apertures in an interior wall of the body or housing of the projection system, and into interior 21.

In this embodiment, the intermediate member 24 is operable to cool a region of the substrate W surrounding the region 37 of the substrate W which is irradiated by the radiation beam (which may be referred to as an exposure region 37). To achieve this, the intermediate member 24 may comprise a cooling apparatus. A suitable cooling apparatus for cooling the substrate W is disclosed in WO2017/005463 which is hereby incorporated by reference.

Figure 5:
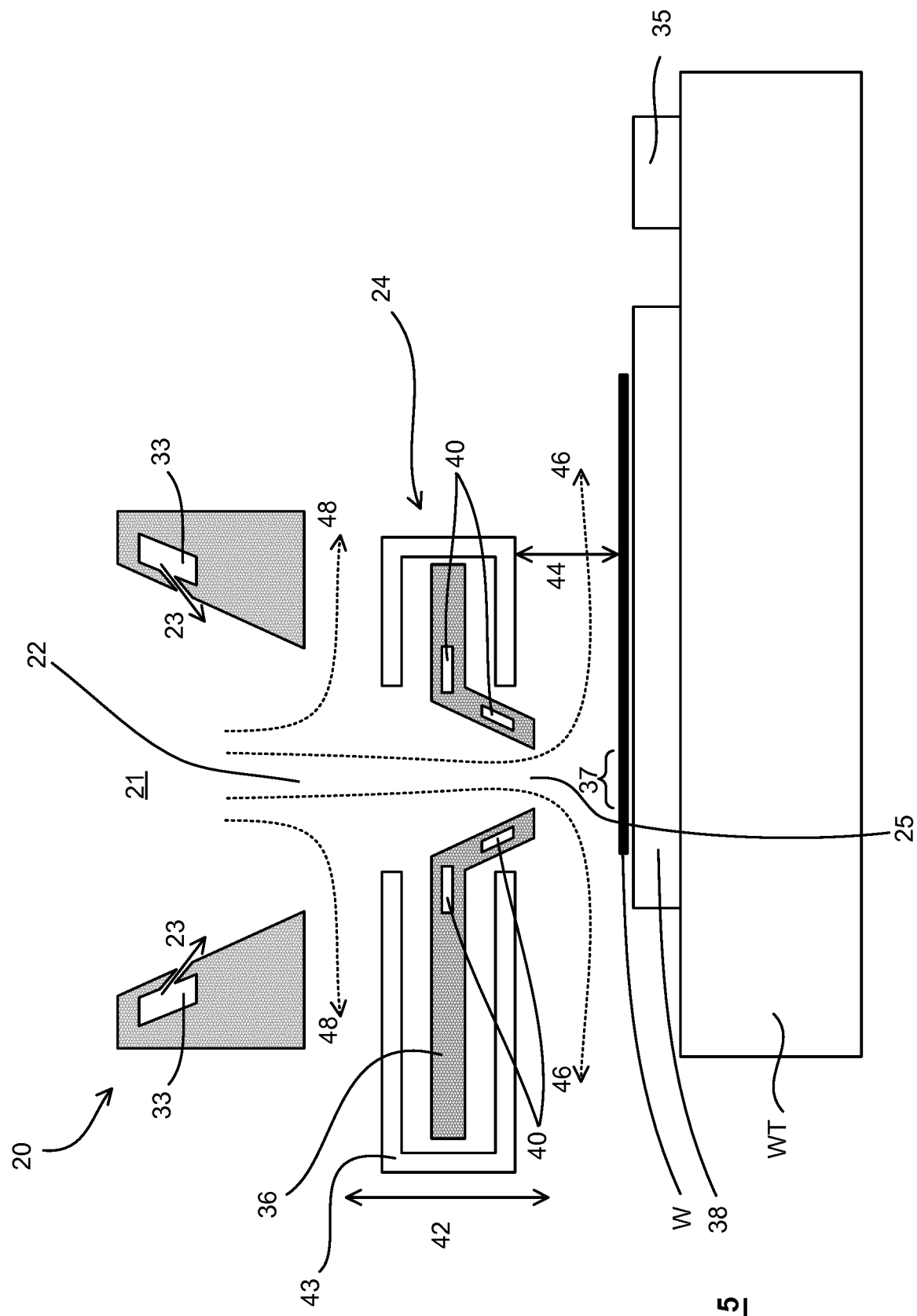
FIG. 5 shows some parts of the apparatus shown in FIG. 2 in greater detail and, for clarity, the sealing member of FIG. 2 is not shown in FIG. 5.

As shown in FIG. 5, the intermediate member 24 comprises a cooling member 36 which may be maintained at a lower temperature than the substrate table WT (and any substrate supported thereby). For example, the cooling member 36 may be maintained at a temperature of around −70° C. The substrate table WT may be maintained at a suitable temperature to ensure stability of substrates W supported thereby such as, for example, around 22° C. (which is, for example, suitable for silicon wafers). The substrate table WT may comprise a clamp 38 (for example an electrostatic clamp) which is suitable for clamping a substrate W to the substrate table WT. The clamp 38 and other parts of the substrate table WT may be provided with a suitable conditioning system arranged to maintain the temperature thereof (and the temperature of any substrate W supported thereby) at a desired temperature (for example 22° C.).

It will be appreciated that the cooling member 36 may be provided with a suitable refrigeration system (for example a closed loop around which coolant is circulated) so as to maintain it at a desired temperature. The cooling member may be formed from a metal and is provided with channels 40 through which a suitable coolant is circulated. Suitable coolants may comprise, for example, nitrogen.

In some embodiments, the intermediate member 24 may be operable to direct a cooling gas flow to a region of the substrate W surrounding the exposure region 37 of the substrate W which is irradiated by the radiation beam B'.

The cooling member 36 of the intermediate member 24 is maintained at a lower temperature than the substrate table WT. The intermediate member 24 further comprises a heat shield 43 which is arranged to thermally insulate the substrate table WT (and any substrate W supported thereby) and the projection system PS and barrier 26 from the cooling member 36.

The intermediate member 24 is movable relative to the projection system PS and the substrate table WT, as shown schematically by arrow 42. In particular, the intermediate member 24 is movable in a direction that is generally perpendicular to a plane of the substrate table WT. The intermediate member 24 is moveable between at least a first, operating position and a second, retracted position, as now described.

The position of the intermediate member 24 may define a configuration of the apparatus 20. When the intermediate member 24 is disposed in the first, operating position the apparatus 20 may be considered to be in a first, operating configuration. When the intermediate member 24 is disposed in the second, retracted position the apparatus 20 may be considered to be in a second, retracted configuration.

In use, when a substrate W is being irradiated by the radiation beam B' the intermediate member 24 may be disposed in the first, operating position. When disposed in the first, operating position the intermediate member 24 may be in close proximity to a region of the substrate W surrounding the exposure region 37 of the substrate W which is being irradiated by the radiation beam B'. With such an arrangement, the intermediate member 24 can act as a seal, or at least a restriction, so as to at least partially block the gas flow from flowing towards the region of the substrate surrounding the exposure region 37 of the substrate W which is being irradiated by the radiation beam B'. It will be appreciated that, as used here the intermediate member 24 being in close proximity to a region of the substrate surrounding the exposure region 37 of the substrate W which is being irradiated by the radiation beam B' is intended to mean sufficiently close that the fluid conductance through the clearance 44 between the intermediate member 24 and the substrate W is significantly smaller than the fluid conductance through the pathway defined between the intermediate member 24 and the projection system PS. That is, the fluid conductance of the pathway 46 that flows through the cooling member 36 and then between the intermediate member 24 and the substrate W is significantly smaller than the fluid conductance through the pathway 48 defined between the intermediate member 24 and the projection system PS.

Figure 6:
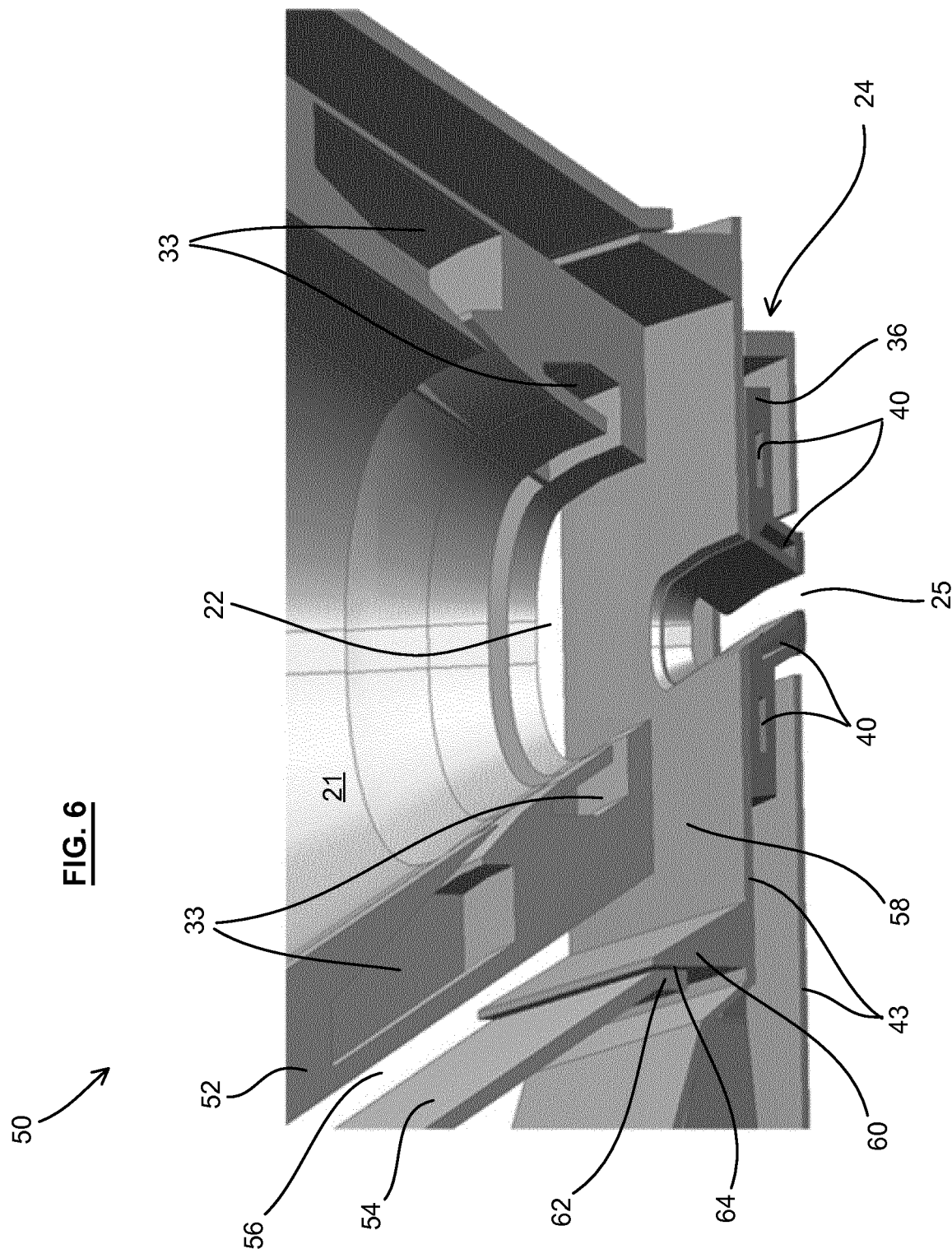
FIG. 6 shows an apparatus according to an embodiment of the present invention, the apparatus being generally of the form of the apparatus shown in FIG. 2, and having a specific embodiment of a sealing member.

As will be discussed further with reference to FIG. 6, the intermediate member 24 is configured such that gas flowing along the pathway 48 defined between the intermediate member 24 and the projection system PS is generally directed away from the substrate table WT.

Although in use, when a substrate W is being irradiated by the radiation beam B', the intermediate member 24 is disposed in the first, operating position (in close proximity to the substrate W), it may be desirable to allow the intermediate member to be movable relative to the projection system PS and substrate table WT (as indicated by arrow 42) to a second, retracted position, for example to prevent the intermediate member 24 from contacting a substrate W. For example, if the substrate table WT moves rapidly and/or unpredictably towards the intermediate member 24 it may be desirable to move the intermediate member 24 so as to avoid contact between the substrate W and the intermediate member 24. Movement of the intermediate member 24, for example by of the order of ±4 mm may be desirable in case an out-of-control situation occurs. For instance, in case a substrate table WT positioning module makes an unplanned fast upward movement, there will be significant damage to the substrate table WT and intermediate member 24 unless the intermediate member can move sufficiently to avoid contact.

Additionally or alternatively, It may be desirable to be able to adjust the clearance 44 between the intermediate member 24 and a substrate W supported by the substrate table WT.

In some embodiments, the gas flow guide (which may be formed by the intermediate member 24 and the sealing member 28 is configured to guide at least a portion of the gas flow through the opening 22 along a fluid pathway of substantially fixed fluid conductance. For example, the gas flow guide formed by the intermediate member 24 and the sealing element 28 guides a portion 30 of the gas 23 along a pathway (including passageway 32) of substantially fixed fluid conductance. It will be appreciated that the gas flow guide may be configured to guide the at least a portion of the gas flow along a fluid pathway of substantially fixed fluid conductance when the apparatus 20 is disposed in a first, operating configuration (for example, when intermediate member 24 is disposed in a first, operating position).

Advantageously, by guiding at least a portion of the gas flow through opening 22 along a fluid pathway of substantially fixed fluid conductance, when the rate of gas 23 production by the fluid lock is constant there will be substantially no variation in the pressure within the interior 21 of the projection system PS or proximate the substrate table WT.

In some embodiments, the gas flow guide may be configured such that more than half of the gas flow through the opening 22 away from the interior 21 is directed away from the substrate W supported by the substrate table WT. It will be appreciated that the gas flow guide may be configured such that more than half of the gas flow through the opening 22 away from the interior 21 is directed away from the substrate W supported by the substrate table WT when the apparatus 20 is disposed in a first, operating configuration (for example, when intermediate member 24 is disposed in a first, operating position).

That is to say, the gas flow guide may be considered to direct gas along a primary pathway, which receives more than half of the gas flow through the opening 22 away from the interior 21. Ensuring that more than half of the gas flow through the opening 22 away from the interior 21 is directed away from the substrate W supported by the substrate table WT may be achieved by ensuring that the fluid conductance of a fluid pathway along which the at least a portion of the gas flow is directed by the gas guide is sufficiently high.

In some embodiments, the gas flow guide may be configured such that at least 80% the gas flow through the opening 22 away from the interior 21 is directed away from the substrate W supported by the substrate table WT. In some embodiments, the gas flow guide may be configured such that at least 90% the gas flow through the opening 22 away from the interior 21 is directed away from the substrate W supported by the substrate table WT.

In some embodiments, the gas flow guide is configured to guide a portion of the gas flow through the opening 22 away from the interior 21 along a fluid pathway having a greater fluid conductance than other available fluid pathways. It will be appreciated that the gas flow guide may be configured to guide the portion of the gas flow through the opening 22 away from the interior 21 along a fluid pathway having a greater fluid conductance than other available fluid pathways when the apparatus 20 is disposed in a first, operating configuration. With such an arrangement gas will preferentially flow along said fluid pathway.

Additionally or alternatively, ensuring that more than half of the gas flow through the opening 22 away from the interior 21 is directed away from the substrate W supported by the substrate table WT may be achieved by ensuring that a pressure difference across a fluid pathway along which the portion of the gas flow is directed by the gas guide is sufficiently high. In some embodiments the gas flow guide may comprises a pump arranged to draw a portion of the gas flow along a fluid pathway. The pump may, for example, comprise a vacuum pump.

It will be appreciated that, as used herein the sealing element 28 being in sealing relationship with the wall of the body of the projection system around substantially the entire perimeter of the opening 22 of the projection system PS is intended to mean that the fluid conductance through any clearance between the sealing element 28 and the wall of the body of the projection system PS or barrier 26 is significantly smaller than the fluid conductance through an alternative exhaust pathway (for example into a cavity formed within a wall of the body of the projection system such as is provided, for example, by passageway 32).

A specific embodiment of the sealing member 28 is now discussed with reference to FIG. 6, which shows an apparatus 50 according to an embodiment of the present invention. It will be appreciated that components of the apparatus 50 in FIG. 6 that are generally equivalent to corresponding components of the apparatus 20 in FIGS. 2 and 5 share common reference numerals therewith. For clarity, the substrate table and substrate are not shown in FIG. 6.

In this embodiment, a wall of the body of the projection system PS may be considered to comprise and inner wall 52, which defines the interior 21 (and opening 22), and an outer wall 54. A cavity 56 is defined by the inner and outer walls 52, 54.

A pathway 58 is defined between the intermediate member 24 and the inner wall 52 of the projection system PS. A sealing member is provided so as to direct gas flowing along this pathway 58 defined between the intermediate member 24 and the projection system PS into the cavity 56 formed within the wall of the body of the projection system PS.

In this embodiment, the sealing member comprises a flange portion 60 provided on the heat shield 43 of the intermediate member 24. The flange portion 60 extends from a main portion of the heat shield 43 of the intermediate member 24 generally perpendicular thereto. The flange portion 60 extends into the cavity 56 formed between the inner and outer walls 52, 54 of the projection system PS. The flange portion 60 is in sealing relationship with a lower flange portion 62 of outer wall 54. A clearance 64 is provided between the flange portion 60 and lower flange portion 62 of the outer wall 54 of the body of the projection system PS. The clearance 64 allows the flange portion 60 (which provides the sealing element 28) to be in sealing relationship with the outer wall 54 of the body of the projection system PS whilst allowing the intermediate member 24 to move relative thereto.

It will be appreciated that the flange portion 60 of the apparatus 50 shown in FIG. 5 is equivalent to, and may be considered to be an embodiment of, the sealing element 28 of the apparatus 20 shown in FIG. 2. It will be further appreciated that the cavity 56 formed between the inner and outer walls 52, 54 of the projection system PS of the apparatus 50 shown in FIG. 5 is equivalent to, and may be considered to be an embodiment of, the passageway 32 of the apparatus 20 shown in FIG. 2.

In some embodiments, the sealing member 28 may comprise a flexible membrane connected between the intermediate member 24 and a wall of the body of the projection system PS. For example, in some embodiments, such a flexible membrane may be provided in place of the flange portion 60 of the heat shield 43 of the intermediate member 24 and may be connected between the heat shield 43 of the intermediate member 24 and the lower flange portion 62 of the outer wall 54 of the body of the projection system PS. Alternatively, in some embodiments, such a flexible membrane may be provided in addition to the flange portion 60 of the heat shield 43 of the intermediate member 24 and may be connected between said flange portion 60 of the heat shield 43 and the lower flange portion 62 of the outer wall 54 of the body of the projection system PS. Such a flexible membrane may allow the intermediate member 24 to be in sealing relationship with the wall of the body of the projection system PS whilst allowing the intermediate member 24 to move relative to the wall.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. An apparatus comprising:
a substrate table for supporting a substrate;
a projection system having a body, the body having a wall defining both an interior and an opening arranged above the substrate, the projection system being con- figured to project a radiation beam through the interior and the opening onto the substrate supported by the substrate table;

a gas lock disposed adjacent to the opening and configured to direct a gas flow through apertures in the wall of the body into the interior and toward the opening of the body and then away from the interior; and a gas flow guide configured to guide at least a portion of the gas flow away from the substrate supported by the substrate table and through a passageway so that the at least a portion of the gas flow exits above the opening.

2. The apparatus of claim 1, wherein the gas lock is configured to provide the gas flow through the opening and away from the interior.

3. The apparatus of claim 1, wherein the gas flow guide is configured to guide the at least a portion of the gas flow along a fluid pathway of substantially fixed fluid conductance.

4. The apparatus of claim 1, wherein the gas flow guide is configured such that more than half of the gas flow from the opening away from the interior is directed away from the substrate supported by the substrate table.

5. The apparatus of claim 1, wherein the gas flow guide is configured to guide the at least a portion of the gas flow along a fluid pathway having a greater fluid conductance than other available fluid pathways.

6. The apparatus of claim 1, wherein the gas flow guide comprises a pump arranged to draw the at least a portion of the gas flow along a fluid pathway.

7. The apparatus of claim 1, further comprising a movement mechanism configured to move the substrate table relative to the opening of the projection system.

8. The apparatus of claim 1, further comprising an intermediate member disposed between the opening and the substrate table, wherein the gas flow guide comprises a pathway defined between the intermediate member and the projection system.

9. The apparatus of claim 8, wherein the intermediate member is configured to direct gas flowing along the pathway defined between the intermediate member and the projection system into a cavity formed within the wall of the body of the projection system.

10. The apparatus of claim 8, wherein the intermediate member comprises a sealing element that extends towards, and is in sealing relationship with, the wall of the body of the projection system around substantially the entire perimeter of the opening of the projection system.

11. The apparatus of claim 10, wherein the sealing element comprises a rigid flange portion, wherein a clearance is provided between the rigid flange portion and a portion of the wall of the body of the projection system that it is in sealing relationship with.

12. The apparatus of claim 10, further comprising a flexible membrane connected between the intermediate member and the wall of the body of the projection system.

13. A method of operating an apparatus comprising a projection system having a body, the body having a wall defining both an interior and an opening arranged above a substrate, the method comprising:

arranging a substrate on a substrate table;

projecting a radiation beam through the interior and the opening of the projection system onto the substrate supported by the substrate table;

directing a gas flow through apertures in the wall of the body into the interior and toward the opening away from the interior; and guiding at least a portion of the gas flow away from the substrate supported by the substrate table and through a passageway so that the at least a portion of the gas flow exits above the opening.

14. The apparatus of claim 8, wherein the intermediate member is configured to cool a region of the substrate surrounding the region of the substrate that, during operation, is irradiated by the radiation beam.

15. The apparatus of claim 14, wherein the intermediate member is configured to direct a cooling gas flow to a region of the substrate surrounding that, during operation, is irradiated by the radiation beam.

16. The apparatus of claim 14, wherein the intermediate member comprises a cooling member that is maintained at a lower temperature than the substrate table, and wherein the intermediate member further comprises a heat shield that is arranged to thermally insulate the substrate table and/or the projection system from the cooling member.

17. A lithographic apparatus comprising:

an illumination system configured to condition a radiation beam;

a support structure constructed to support a patterning device, the patterning device being capable of imparting the radiation beam with a pattern in its cross-section to form a patterned radiation beam;

a projection system having a body, the body having a wall defining both an interior and an opening arranged above a substrate, the projection system being configured to project the radiation beam through the interior and the opening onto the substrate supported by a substrate table;

a gas lock disposed adjacent to the opening and configured to direct a gas flow through apertures in the wall of the body into the interior and toward the opening of the body and then away from the interior; and a gas flow guide configured to guide at least a portion of the gas flow away from the substrate supported by the substrate table and through a passageway so that the at least a portion of the gas flow exits above the opening, wherein the projection system is configured to receive the patterned radiation beam and to project it onto the substrate supported by the substrate table.

18. The apparatus of claim 13, wherein the intermediate member is movable relative to the projection system between at least a first operating position and a second retracted position.

19. The method of claim 13, further comprising drawing the gas flow from the opening away from the interior and away from the substrate supported by the substrate table.

* * * * *